United States Patent
Aparin et al.

(10) Patent No.: US 7,965,134 B2
(45) Date of Patent: Jun. 21, 2011

(54) SPUR ATTENUATION DEVICES, SYSTEMS, AND METHODS

(75) Inventors: Vladimir Aparin, San Diego, CA (US); Namsoo Kim, San Diego, CA (US); Lennart K. Mathe, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 71 days.

(21) Appl. No.: 12/494,068

(22) Filed: Jun. 29, 2009

(65) Prior Publication Data

US 2010/0244927 A1    Sep. 30, 2010

Related U.S. Application Data

(60) Provisional application No. 61/164,269, filed on Mar. 27, 2009.

(51) Int. Cl.
*H04B 1/10* (2006.01)

(52) U.S. Cl. .......................... 327/551; 327/363; 455/307

(58) Field of Classification Search .................. 327/363, 327/551–559; 455/307
See application file for complete search history.

(56) References Cited

U.S. PATENT DOCUMENTS

| | | | |
|---|---|---|---|
| 5,995,567 A | 11/1999 | Cioffi et al. | |
| 7,483,685 B2 * | 1/2009 | Lewis | 455/296 |
| 2008/0233894 A1 | 9/2008 | Aparin | |

FOREIGN PATENT DOCUMENTS

EP    1531553    5/2005

OTHER PUBLICATIONS

International Search Report and Written Opinion—PCT/US2010/028738, International Search Authority—European Patent Office—Aug. 10, 2010.

* cited by examiner

*Primary Examiner* — Lincoln Donovan
*Assistant Examiner* — William Hernandez
(74) *Attorney, Agent, or Firm* — Ramin Mobarhan (57) ABSTRACT

Exemplary embodiments of the invention disclose signal filtering. In an exemplary embodiment, a filter device may comprise a subtractor operably coupled between an input and an output and configured to receive an input signal comprising a desired component and at least one undesired frequency component. The filter device may further include a feedback loop configured to receive at least one of the input signal and an output signal from the subtractor and convey a feedback signal comprising at least one undesired component to the subtractor. Each undesired component of the feedback signal corresponds to an associated undesired component of the input signal. Furthermore, the subtractor subtracts the feedback signal from the input signal and convey the output signal.

26 Claims, 10 Drawing Sheets

SPUR ATTENUATION DEVICES, SYSTEMS, AND METHODS

BACKGROUND

The present Application for Patent claims priority to Provisional Application Ser. No. 61/164,269, filed on Mar. 27, 2009, entitled "High-Q active bandpass filter and spur attenuator", and assigned to the assignee hereof and hereby expressly incorporated by reference herein.

1. Field

The present invention relates generally to communication, and more specifically to techniques for processing a signal in a communication system.

2. Background

In a communication system, a transmitter modulates data onto a radio frequency (RF) carrier signal and generates an RF modulated signal that is more suitable for transmission. The transmitter then transmits the RF modulated signal via a wireless channel to a receiver. The receiver receives the transmitted signal, filters and amplifies the received signal, frequency down-converts the amplified signal from RF to baseband, and digitizes the baseband signal to obtain samples. The receiver then processes the samples to recover the data sent by the transmitter.

A receiver and transmitter typically generate various undesired signals, which are often called "spurious responses" or "spurs." For example, the spurs may be harmonics of a reference oscillator, harmonics of a sampling clock used to digitize the baseband signal, harmonics of clocks used for digital circuits, mixing products of RF components, and so on. These spurs may degrade receiver sensitivity through reciprocal mixing with received jamming signals or degrade transmitter emission mask.

There is therefore a need in the art for systems, methods, and devices related to spur attenuation in a receiver and a transmitter.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. In addition, like reference numerals may be used to denote like features throughout the specification and figures.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments and is not intended to represent the only embodiments in which the present disclosed aspects can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein.

Various exemplary embodiments of the disclosure are described below. It should be apparent that the teachings herein may be embodied in a wide variety of forms and that any specific structure, function, or both being disclosed herein is merely representative. Based on the teachings herein one skilled in the art should appreciate that an exemplary embodiment disclosed herein may be implemented independently of any other exemplary embodiments and that two or more of these exemplary embodiments may be combined in various ways. For example, an apparatus may be implemented, or a method may be practiced, using any number of the exemplary embodiments set forth herein. In addition, such an apparatus may be implemented, or such a method may be practiced, using other structure, functionality, or structure and functionality in addition to or other than one or more of the exemplary embodiments set forth herein.

The spur attenuation techniques described herein may be used for various wireless communication systems such as a code division multiple access (CDMA) system, a time division multiple access (TDMA) system, a frequency division multiple access (FDMA) system, an orthogonal frequency division multiple access (OFDMA) system, an orthogonal frequency division multiplexing (OFDM) system, a single-carrier frequency division multiple access (SC-FDMA) system, and so on. A CDMA system may implement one or more radio access technologies such as cdma2000, Wideband-CDMA (W-CDMA), and so on. cdma2000 covers IS-95, IS-2000, and IS-856 standards. A TDMA system may implement Global System for Mobile Communications (GSM). GSM and W-CDMA are described in documents from a consortium named "3rd Generation Partnership Project" (3GPP). cdma2000 is described in documents from a consortium named "3rd Generation Partnership Project 2" (3GPP2). 3GPP and 3GPP2 documents are publicly available. An OFDMA system utilizes OFDM. An OFDM-based system transmits modulation symbols in the frequency domain whereas an SC-FDMA system transmits modulation symbols in the time domain. In general, the techniques described herein may be used for any communication system in which a spur to be suppressed occupies only a portion of the desired signal bandwidth. The techniques are especially applicable for wideband communication systems such as, e.g., CDMA and OFDM-based systems.

The spur attenuation techniques may be used for a wireless device as well as a base station in a wireless communication system. A base station is generally a fixed station that communicates with the wireless devices and may also be called a base transceiver system (BTS), a Node B, an access point, or some other terminology. A wireless device may be fixed or mobile and may also be called a mobile station, a user equipment, a terminal, a subscriber unit, or some other terminology. A wireless device may be a cellular phone, a personal digital assistant (PDA), a wireless modem card, and so on. For clarity, much of the description below is for a wireless device in a CDMA system, which may implement cdma2000 or W-CDMA.

A conventional communication system and frequency spectrum of a signal output from the conventional communication system will first be discussed with reference to FIGS. 1 and 2. A filtering device according to one or more exemplary embodiments will then be described with reference to FIG. 3. Thereafter, with reference to FIGS. 2-4, a frequency spectrum of an output signal generated by the filtering device will be discussed. A contemplated operation of the filtering device will then be described with reference to FIG. 3. Furthermore, with reference to FIG. 5, a communication system including the filtering device will be described, and methods of filtering a signal will be described with reference to FIGS. 6 and 7. Additional filtering devices, in accordance with other exemplary embodiments will then be discussed with reference to FIGS. 8-10.

Figure 1:
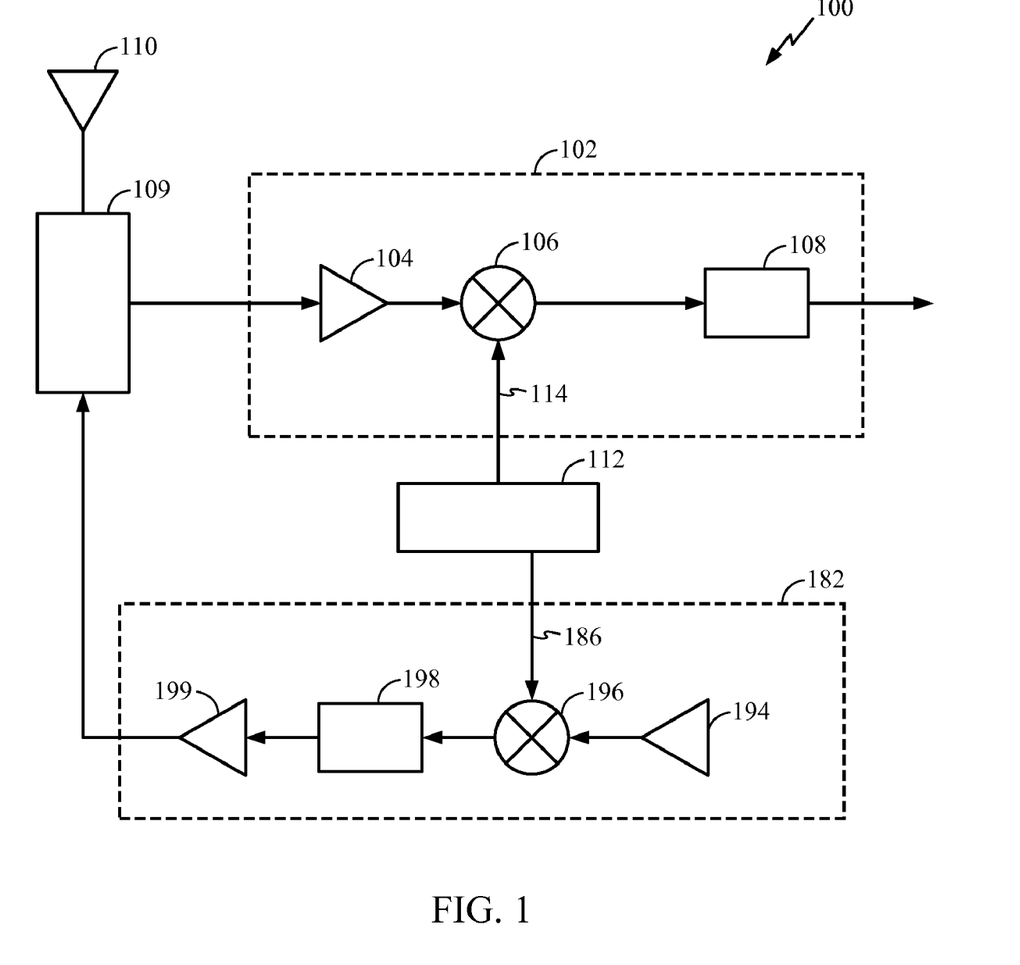
FIG. 1 is a block diagram of a conventional filtering system.

FIG. 1 illustrates a block diagram of a conventional communication system 100 including a receiver 102 and a transmitter 182. As illustrated in FIG. 1, receiving 102 is coupled to an antenna 110 via a duplexer 109 and includes a low noise amplifier (LNA) 104, a mixer 106, and a baseband filter 108. Transmitter 182 is coupled to antenna 110 via duplexer 109 and includes a variable gain amplifier (VGA) 194, a mixer 196, a baseband filter 198, and a power amplifier 199. Within receiver 102, low noise amplifier 104 may receive an RF signal from antenna 110 and provide an amplified RF signal to mixer 106. Mixer 106 frequency down-converts the amplified RF signal with a local oscillator signal 114 transmitted from an LO generator 112 and, thereafter, provides a down-converted signal to baseband filter 108. Baseband filter 108 filters the baseband signal and provides an output baseband signal to an analog-to-digital converter (not shown). Within transmitter 182, variable gain amplifier (VGA) 194 amplifies an analog signal with a variable gain and mixer 196 frequency upconverts the amplified signal from baseband to RF with a signal 186 from LO generator 112. Bandpass filter 198 filters the upconverted signal to remove images caused by digital-to-analog conversion and the frequency upconversion. Power amplifier 199 amplifies the upconverted signal and provides an output RF signal having the required power level.

As understood by a person having ordinary skill in the art, spurs may be generated internally within a communication system by various means. For example, with reference to FIG. 1, LO generator 112 may generate one or more LO signals for frequency down-conversion within receiver 102 and one or more LO signals for frequency up-conversion within transmitter 182. The LO signals may mix together and/or with other clocks within communication system 100 or with externally received undesired signals to generate spurs that fall within a frequency band of interest. Spurs may also come from external interfering sources and may appear in the received RF signal from antenna 110. Internally generated spurs are typically tones at deterministic frequencies whereas external spurs may be narrowband signals at random frequencies. In any case, the spurs desense a receiver for each CDMA channel affected by these spurs.

Figure 2:
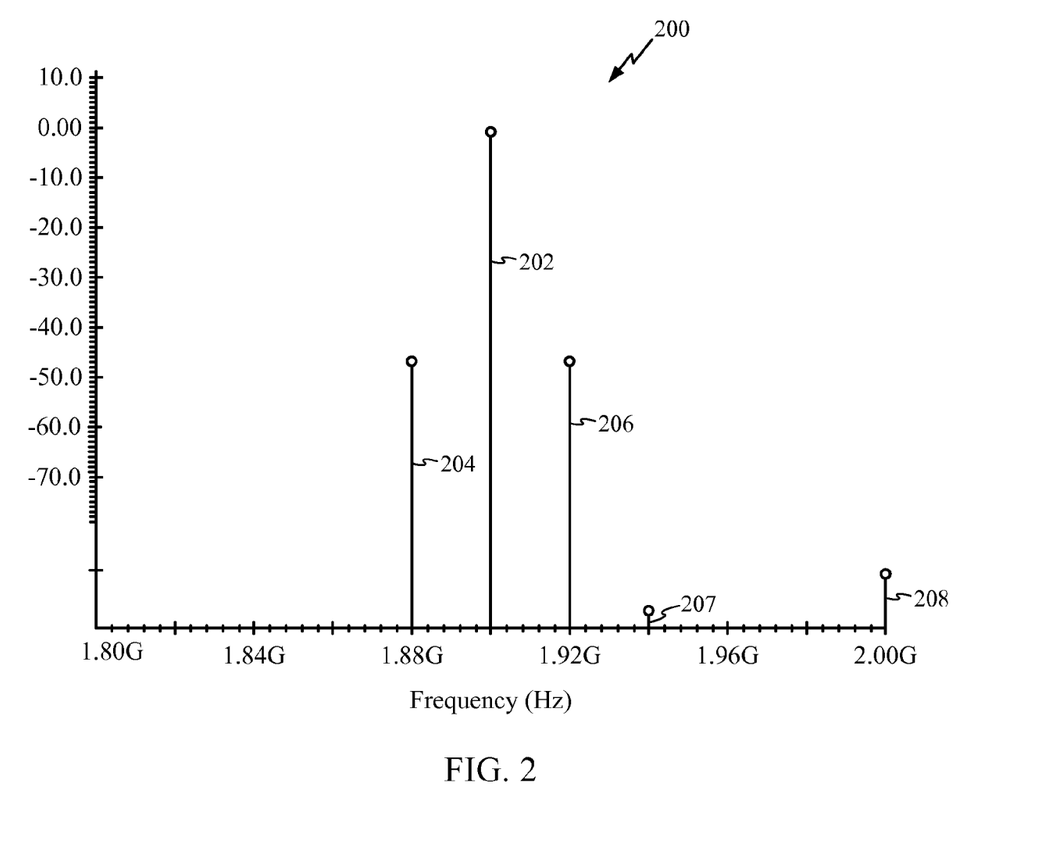
FIG. 2 is a diagram illustrating a frequency spectrum of a signal having a dominant frequency response and a plurality of undesired frequency responses.

FIG. 2 depicts a frequency spectrum 200 of a signal generated by a local oscillator, such as LO generator 112 (see FIG. 1). Spectrum 200 includes a desired component 202 and a plurality of undesired components ("spurious responses" or "spurs") 204, 206, 207, and 208. As illustrated, desired component 202 is positioned at 1.9 GHz and has an amplitude of approximately 1.0 dB. Undesired components 204 and 206 are positioned at 1.88 GHz and 1.92 GHz, respectively, and each have an amplitude of approximately 46 dB. Moreover, undesired component 207 is positioned at 1.94 GHz and has an amplitude of approximately −97 dB and undesired component 208 is positioned at 2.0 GHz and has an amplitude of approximately −87 dB. As mentioned above, a desired signal contaminated with spurious responses may result in poor system performance. Conventional attempts to attenuate these undesirable spurs have involved utilizing high-Q passive filters, which typically occupy a large silicon area.

Figure 3:
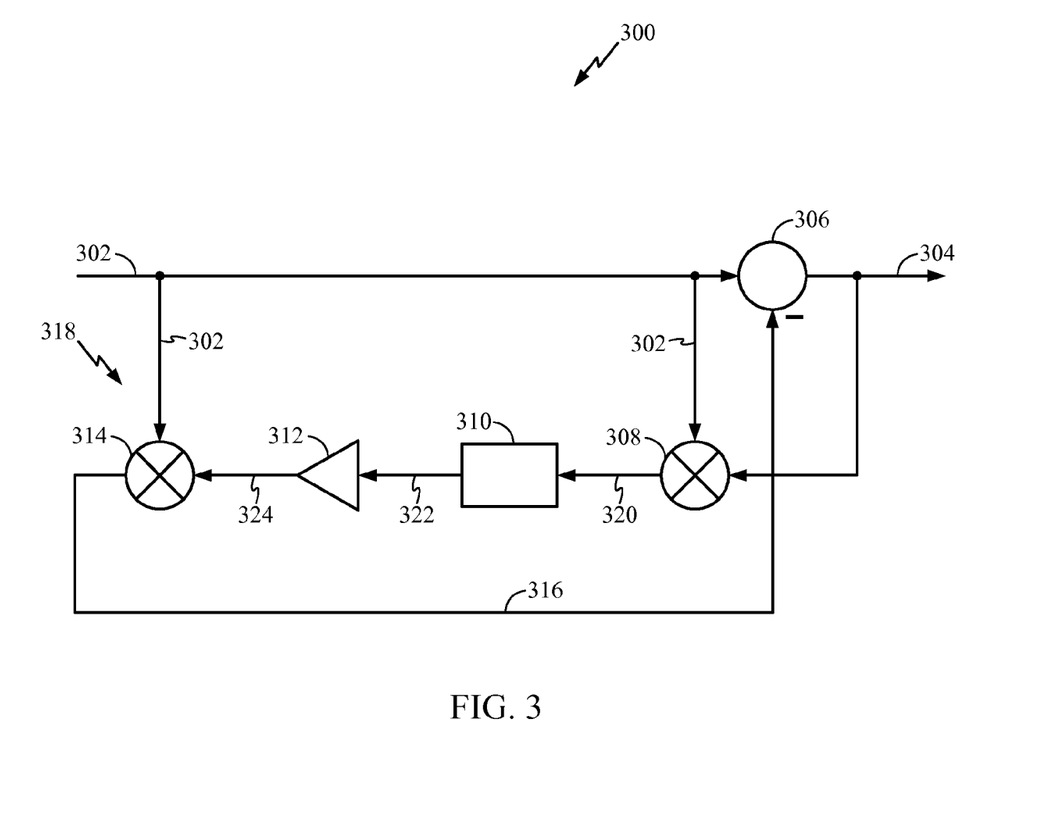
FIG. 3 is a block diagram of a filtering device, in accordance with an aspect of the disclosed exemplary embodiment.

FIG. 3 illustrates a block diagram of a filtering device 300, in accordance with an aspect of the disclosed exemplary embodiment. Filtering device 300 includes a subtractor 306 configured to receive each of an input signal 302 and a feedback signal 316. For example only, input signal 302 may comprise a signal transmitted from a local oscillator. As described more fully below, subtractor 306 may also be configured to generate output signal 304 by subtracting feedback signal 316 from input signal 302. It is noted that input signal 302 may comprise a signal having a desired component (i.e., a dominant component) and at least one undesired component (i.e., a spur). A "desired component" may also be referred to herein as a "desired response," a "dominant response," or a "dominant component." Additionally, an "undesired component" may be referred to herein as an "undesired response," a "spur," or a "spurious response." For example only and not by way of limitation, input signal 302 may comprise an amplitude modulated signal.

Filtering device 300 further includes a feedback loop 318 comprising a first multiplier 308, a filter 310, a buffer 312 and a second multiplier 314. For example only, first multiplier 308 and second multiplier 314 may each comprise a mixer. As mentioned above, feedback loop 318 may be configured to convey feedback signal 316 to subtractor 306. First multiplier 308 may be configured to receive input signal 302 and output signal 304 and, may further be configured to multiply input signal 302 with output signal 304 to generate signal 320, which may be conveyed to filter 310. Although, first multiplier 308, as illustrated in FIG. 3, is configured to multiply input signal 302 and output signal 304, according to other exemplary embodiments described below, first multiplier 308 may be configured to receive output signal 304 and thereafter, multiply output signal 304 by itself to generate a resultant signal.

As mentioned above, input signal 302 may include a desired component and one or more undesired components. Furthermore, output signal 304 may also include a desired component. Therefore, by multiplying input signal 302 by output signal 304, first multiplier 308 may generate a signal 320 having a desired component corresponding to the desired component of input signal 302, wherein the desired component of signal 320 may be frequency down-converted in comparison to the desired component of input signal 302.

Signal 320 may also include one or more undesired components, wherein each undesired component of signal 320 corresponds to an associated undesired component of input signal 302. Further, each undesired component of signal 320 may be frequency down-converted in comparison to the associated undesired component of input signal 302. More specifically, first multiplier 308 may generate a signal 320 having components substantially resembling the components of input signal 302 and wherein the desired component of signal 320 is down-converted to DC (i.e., zero (0) Hz) and the one or more undesired components of signal 320 are down-converted to non-DC frequencies (i.e., at either negative or positive frequencies from DC). As a non-limiting example, if input signal 302 includes a desired component at approximately 1.9 GHz, then signal 320 may have a desired component at DC (i.e., 0 Hz). Furthermore, if input signal 302 includes a first undesired component at 1.88 GHz and a second undesired component at 1.92 GHz, then signal 320 may have a first undesired component at a non-DC frequency (i.e., approximately −20 MHz) and a second undesired component at another non-DC frequency (i.e., approximately 20 MHz). Furthermore, it is noted that, according to one exemplary embodiment, first multiplier 308 may comprise a frequency modulation (FM) detector configured to at least partially cancel frequency modulation noise, as known by a person having ordinary skill in the art.

Filter 310 may be configured to receive signal 320 and reject the DC component (i.e., the desired component) and pass the non-DC components (i.e., the one or more undesired frequency components) as signal 322. According to one exemplary embodiment, filter 310 may comprise a high-pass filter. Furthermore, in accordance with another exemplary embodiment, filter 310 may comprise a bandpass filter, as described more fully below. In any event, a cut-off frequency of filter 310 should be properly selected to reject the DC component (i.e., the desired component) and preserve (i.e., transmit) the non-DC components (i.e., the undesired components). Moreover, buffer 312, which is operably coupled between filter 310 and second multiplier 314, may be configured to receive signal 322, amplify signal 322, and output an amplified signal 324. Although buffer 312 is illustrated as a distinct element within feedback loop 318, buffering functionality may be embedded within first multiplier 308, filter 310, second multiplier 314, or any combination thereof.

Second multiplier 314 may be configured to receive input signal 302 and amplified signal 324, and multiply input signal 302 by amplified signal 324 to generate feedback signal 316, which may be conveyed to subtractor 306. In particular, second multiplier 314 may be configured to multiply input signal 302 by amplified signal 324 to generate feedback signal 316 having one or more undesired components, wherein each undesired component of signal 316 may correspond to and be up-converted in comparison to an associated undesired component of amplified signal 324. Therefore, each undesired component of feedback signal 316 may correspond to an associated undesired component of input signal 302. As a result, the one or more undesired components of feedback signal 316 may substantially match the one or more undesired components of input signal 302. For example only, if input signal 302 includes a first undesired component at 1.88 GHz having an amplitude of approximately −46 dB and a second undesired component at 1.92 GHz having an amplitude of approximately −46 dB, then feedback signal 316 may have a first undesired component at approximately 1.88 GHz having an amplitude of approximately −46 dB and a second undesired component at approximately 1.92 GHz having an amplitude of approximately −46 dB. Although, second multiplier 314, as illustrated in FIG. 3, is configured to multiply input signal 302 by signal 324, according to other exemplary embodiments described below, second multiplier 314 may be configured to receive input signal 302 and thereafter, multiply input signal 302 by signal 324 to generate a resultant signal.

Upon receipt of feedback signal 316, subtractor 306 may be configured to subtract feedback signal 316 (i.e., a signal having one or more undesired responses) from input signal 302 (i.e., a signal having a desired response and one or more undesired responses correlating with the one or more undesired responses of feedback signal 316) and, thereafter, convey output signal 304. Accordingly, output signal 304 may include the desired component of input signal 302 and will further include at least one attenuated undesired component as a result of subtracting feedback signal 316 from input signal 302.

It is noted that a phase delay may exist between feedback signal 316 and input signal 302 and, furthermore, this phase delay may vary for varying frequencies of input signal 302. In addition, spurious responses further removed (i.e., in frequency) from a dominant signal ("distant spurious responses") may exhibit more of a phase delay than spurious responses closer (i.e., in frequency) to a dominant signal. Accordingly, if a spurious response becomes 180 degrees out of phase from input signal 302, subtractor 306 may undesirably add the spurious response to input signal 302 and, therefore, the spurious response will be amplified instead of attenuated. Therefore, it may be desirable to configure filter 310 to function as a low-pass filter for distant spurious responses and, additionally, as a high-pass filter, which rejects DC. Stated another way, filter 310 may comprise a bandpass filter.

Figure 4:
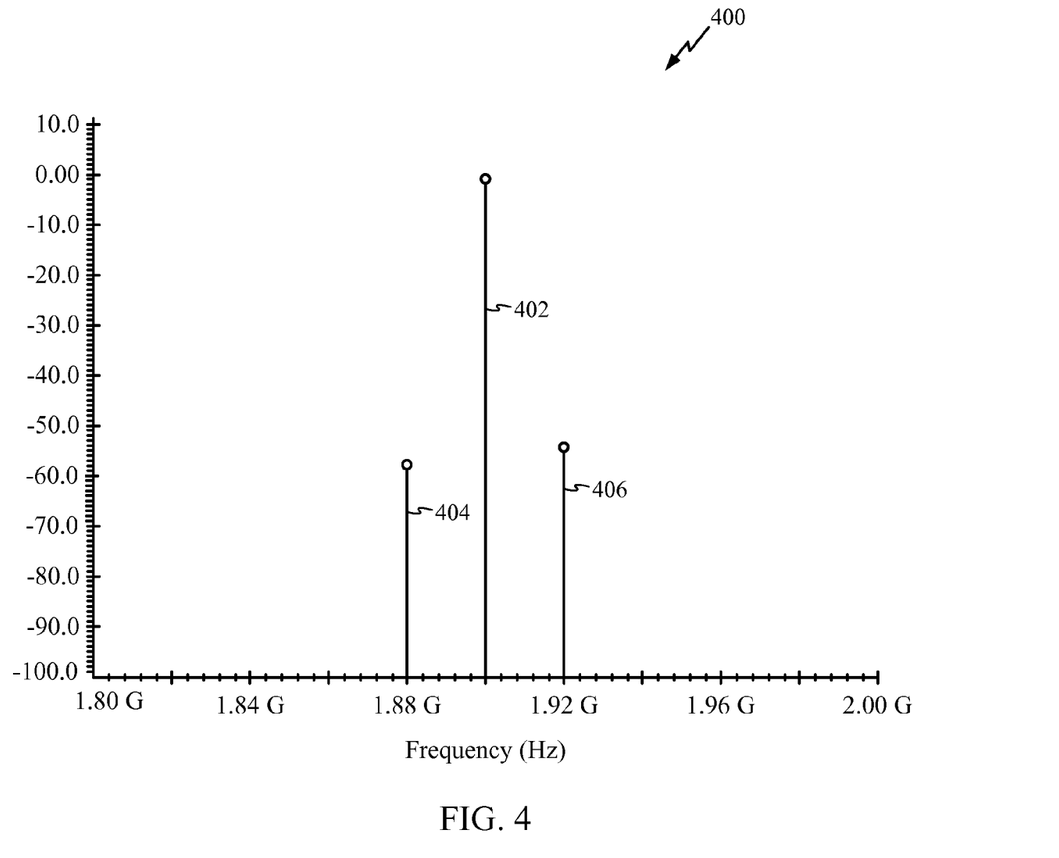
FIG. 4 is a diagram illustrating a frequency spectrum of a signal output from the filtering device of FIG. 3 and including a dominant frequency response and undesired frequency responses.

FIG. 4 is a frequency spectrum 400 of output signal 304 generated by filtering device 300 upon receipt of input signal 302. It is noted that input signal 302 comprises the signal of frequency spectrum 200 illustrated in FIG. 2. Accordingly, input signal 302 includes a desired response (i.e., signal 202; see FIG. 2) positioned at 1.9 GHz and having an amplitude of approximately 1.0 dB. Furthermore, input signal 302 includes an undesired response positioned at 1.88 GHz and having an amplitude of approximately −46 dB (i.e., signal 204; see FIG. 2), undesired response 206 positioned at 1.92 GHz and having an amplitude of approximately −46 dB (i.e., signal 206; see FIG. 2), undesired response 207 positioned at 1.94 GHz and having an amplitude of approximately −97 dB, and undesired response 208 positioned at 2.0 GHz and having an amplitude of approximately −87 dB (i.e., signal 208; see FIG. 2).

With reference to FIGS. 2 and 4, the undesired response positioned at 1.88 GHz has been attenuated from approximately −46 dB (i.e., signal 204; see FIG. 2) to approximately −57 dB (signal 404; see FIG. 4). Furthermore, the undesired response positioned at 1.92 GHz has been attenuated from approximately −46 dB (i.e., signal 206; see FIG. 2) to approximately −55 dB (signal 406; see FIG. 4). Moreover, it is noted that the desired response positioned at 1.9 GHz has been attenuated from approximately 1.0 dB (i.e., signal 202; see FIG. 2) to approximately 0.5 dB (signal 402; see FIG. 4). Accordingly, filtering device 300 may provide for spur attenuation while removing only a small portion of a desired response and, therefore, higher sensitivity and improved performance may be achieved for a communication system including filtering device 300. It is noted that energy from attenuated spurs (i.e., signals 404 and 406) may be spread out resulting in additional, weaker spurs positioned at frequencies further removed (i.e., in frequency) from a dominant signal (i.e., signal 402) than signals 404 and 406.

With reference again to FIG. 3, a contemplated operation of filtering device 300 will now be described. Initially, input signal 302, having a dominant response and at least one spurious response, may be received at first multiplier 308 and subtractor 306. Subtractor 306 may subtract feedback signal 316 from input signal 302 to generate output signal 304. It is noted that at a first instance in time upon receipt of input signal 302, output signal 304 may be substantially equal to input signal 302. Upon receipt of output signal 304 and input signal 302, first multiplier 308 may multiply output signal 304 by input signal 302 to generate signal 320. As described above, signal 320 may include a signal substantially resembling input signal 302, wherein a dominant response and each spurious response of signal 320 is frequency down-converted in comparison to input signal 302.

Thereafter, signal 320 may be transmitted to filter 310, which filters out the dominant response of signal 320 and transmits each spurious response of signal 320 as signal 322. Subsequently, signal 322 may be amplified by buffer 312 and conveyed to second multiplier 314 as signal 324. Upon receipt of signal 324, second multiplier 314 may multiply signal 324 by input signal 302 to generate feedback signal 316. As described above, feedback signal 316 may include a signal substantially resembling signal 324, wherein each spurious response of feedback signal 316 is frequency up-converted and, therefore each spurious response of feedback signal 316 may substantially resemble an associated spurious response of input signal 302. Thereafter, feedback signal 316 is conveyed to subtractor 306, which subtracts feedback signal 316 from input signal 302 to generate output signal 304.

Figure 8:
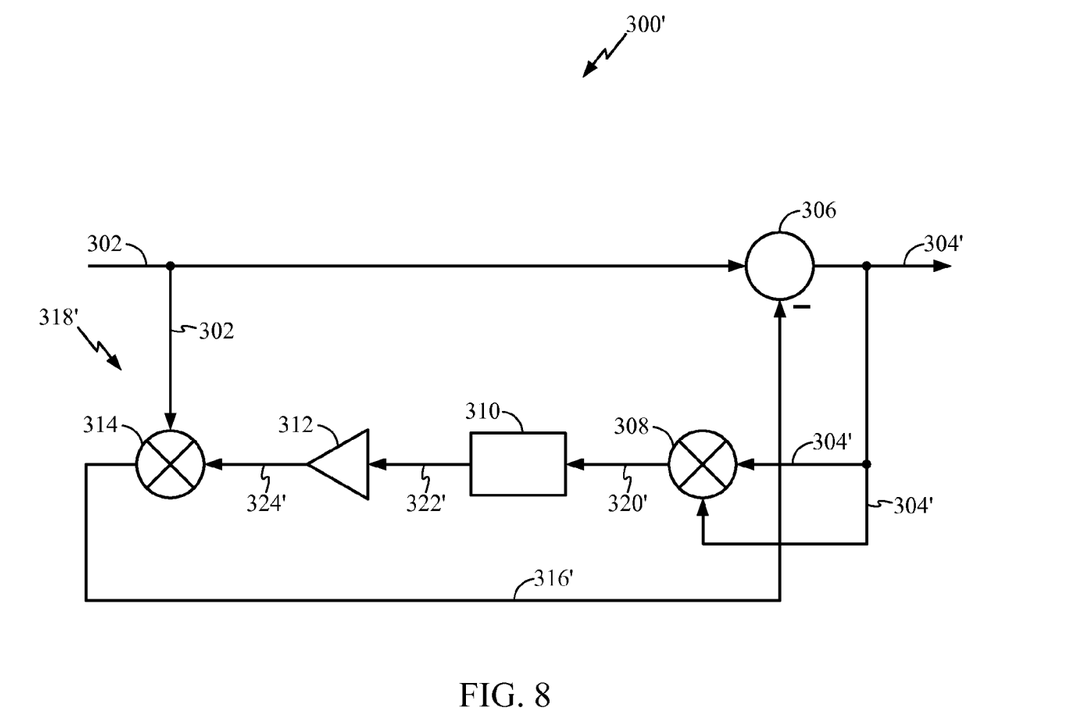
FIG. 8 is a block diagram of another filtering device, in accordance with an aspect of the disclosed exemplary embodiment.

FIG. 8 is block diagram of another filtering device 300', in accordance with an exemplary embodiment. Filtering device 300' includes the elements of filtering device 300, however, instead of being configured to receive input signal 302 and output signal 304, first multiplier 308 is configured to receive output signal 304' and, thereafter, multiply output signal 304' by itself to generate signal 320'. Signal 320' may include a signal substantially resembling input signal 302, wherein a dominant response and each spurious response of signal 320' is frequency down-converted in comparison to input signal 302. Subsequently, signal 320' may be transmitted to filter 310, which filters out the dominant response of signal 320' and transmits each spurious response of signal 320' as signal 322'. Thereafter, signal 322' may be amplified by buffer 312 and conveyed to second multiplier 314 as signal 324'. Upon receipt of signal 324', second multiplier 314 may multiply signal 324' by input signal 302 to generate feedback signal 316'. Feedback signal 316' may include a signal substantially resembling signal 324', wherein each spurious response of feedback signal 316' is frequency up-converted and, therefore each spurious response of feedback signal 316' may substantially resemble an associated spurious response of input signal 302. Thereafter, feedback signal 316' is conveyed to subtractor 306, which subtracts feedback signal 316' from input signal 302 to generate output signal 304'.

Figure 9:
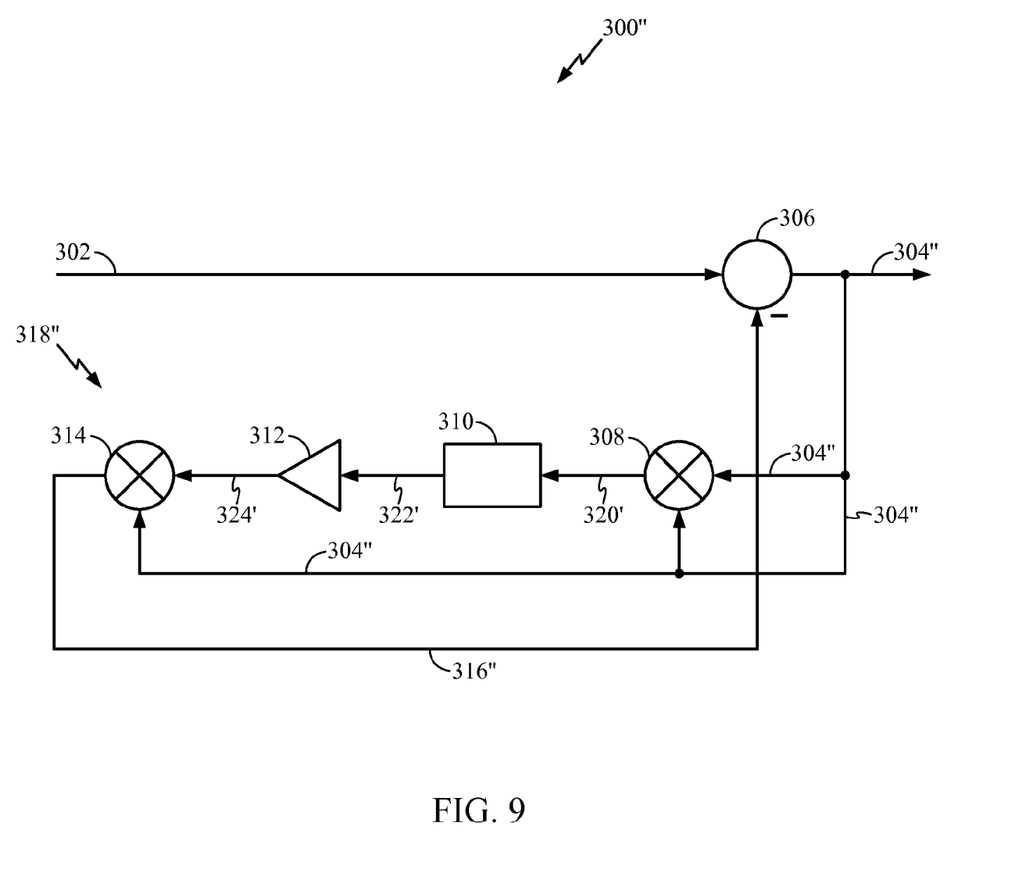
FIG. 9 is a block diagram of another filtering device, in accordance with an aspect of the disclosed exemplary embodiment.

FIG. 9 is block diagram of another filtering device 300", in accordance with an exemplary embodiment. Filtering device 300" includes the elements of filtering device 300', however, instead of being configured to receive input signal 302, second multiplier 314 may be configured to receive output signal 304 and, thereafter, multiply output signal 304 by signal 324' generate feedback signal 316". Feedback signal 316" may include a signal substantially resembling signal 324', wherein each spurious response of feedback signal 316" is frequency up-converted and, therefore each spurious response of feedback signal 316" may substantially resemble an associated spurious response of input signal 302. Thereafter, feedback signal 316" is conveyed to subtractor 306, which subtracts feedback signal 316" from input signal 302 to generate output signal 304".

Figure 10:
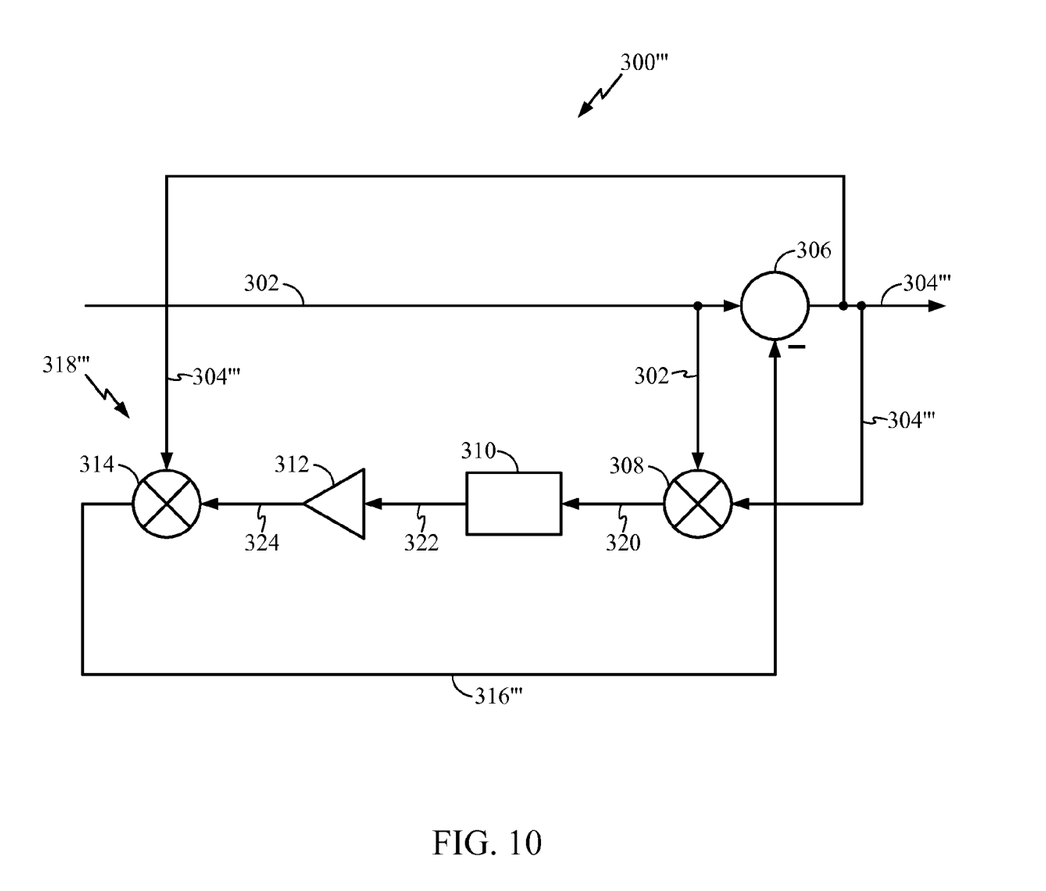
FIG. 10 is a block diagram of yet another filtering device, in accordance with an aspect of the disclosed exemplary embodiment.

FIG. 10 is block diagram of yet another filtering device 300''', in accordance with an exemplary embodiment. Filtering device 300''' includes the elements of filtering device 300, however, instead of being configured to receive input signal 302, second multiplier 314 may be configured to receive output signal 304''' and, thereafter, multiply output signal 304''' by signal 324 generate feedback signal 316'''. Feedback signal 316''' may include a signal substantially resembling signal 324, wherein each spurious response of feedback signal 316''' is frequency up-converted and, therefore each spurious response of feedback signal 316''' may substantially resemble an associated spurious response of input signal 302. Thereafter, feedback signal 316''' is conveyed to subtractor 306, which subtracts feedback signal 316''' from input signal 302 to generate output signal 304'''.

Figure 5:
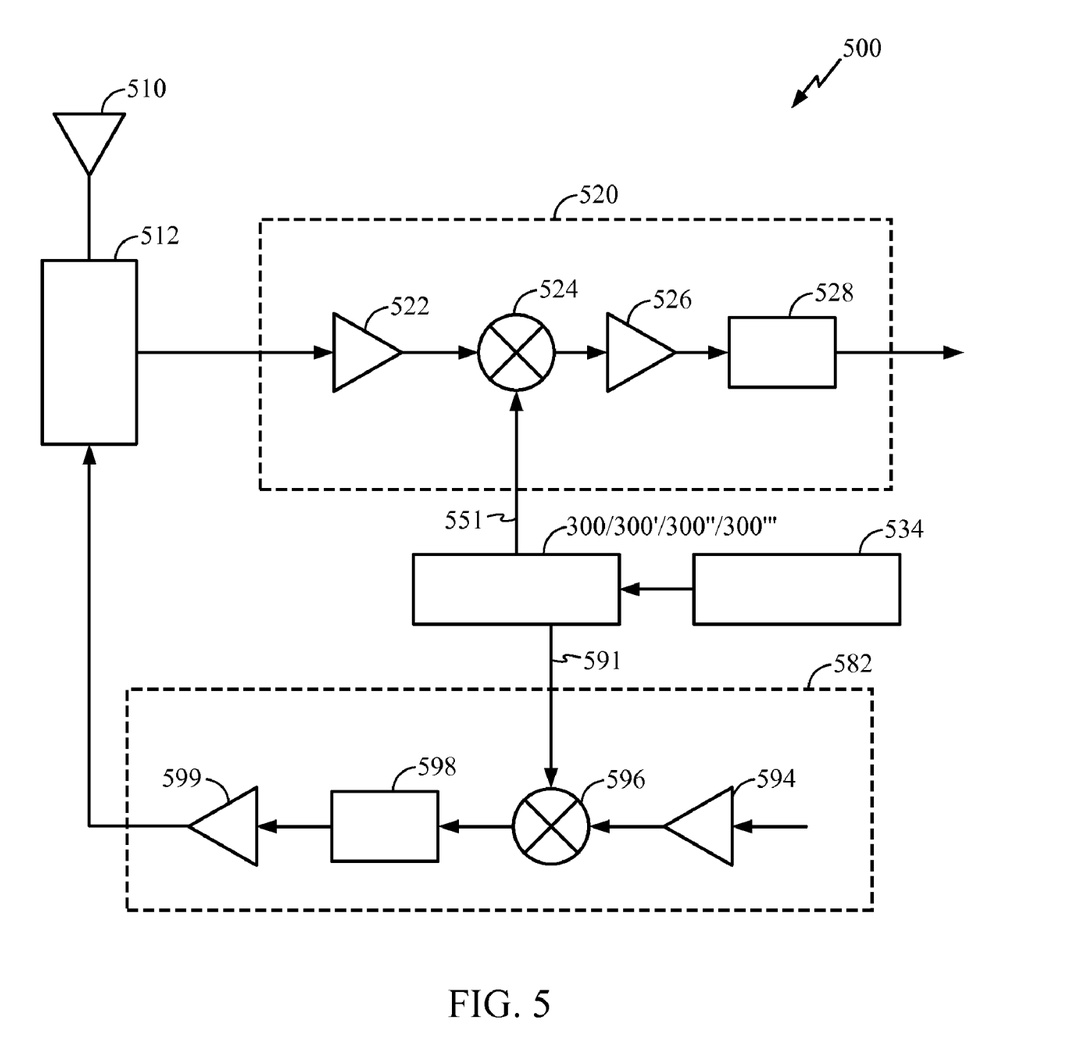
FIG. 5 is a block diagram of a communications system comprising a filtering device, in accordance with an aspect of the disclosed exemplary embodiment.

FIG. 5 shows a block diagram of a communication system 500, in accordance with one or more exemplary embodiments. On a receive path, an antenna 510 may receive one or more RF modulated signals from one or more base stations (not shown) and may also receive interfering signals from other transmitters. Antenna 510 is configured to provide a received RF signal to a duplexer 112. Duplexer 512 is configured to filter the received RF signal for a desired forward link (or downlink) frequency band and provide an input RF signal to a receiver 520. The desired frequency band may be the cellular band, the PCS band, or some other frequency band.

In general, a receiver may implement a super-heterodyne architecture or a direct-to-baseband architecture. In the super-heterodyne architecture, the input RF signal is frequency down-converted in multiple stages (e.g., from RF to an intermediate frequency (IF) in one stage, and then from IF to baseband in another stage). In the direct-to-baseband architecture, the input RF signal is frequency down-converted from RF directly to baseband in one stage. The super-heterodyne and direct-to-baseband architectures may use different circuit blocks and/or have different circuit requirements. Although exemplary embodiments are not so limited, the following description is directed to the direct-to-baseband architecture.

Within receiver 520, a low noise amplifier (LNA) 522 may receive and amplify the input RF signal with a fixed or variable gain and provide an amplified RF signal. A local oscillator (LO) generator 534 may generate and transmit a local oscillator signal 550 to filtering device 300/300'/300"/300''', which may provide spur attenuation, as described above, and transmit an output signal 551 to a mixer 524. Mixer 524 may frequency down-convert the amplified RF signal with output signal 551 from filtering device 300/300'/300"/300''' and provide a down-converted signal. The frequency of the local oscillator signal 550 may be selected such that the RF modulated signal for a desired CDMA channel is down-converted to baseband or near-baseband. A variable gain amplifier (VGA) 526 may then amplify the down-converted signal with a variable gain and provide an input baseband signal having the desired amplitude. In addition, receiver 520 may include one or more additional filters, such as a baseband filter 528.

Within transmitter 582, a variable gain amplifier (VGA) 594 may be configured to amplify an analog signal with a variable gain. Local oscillator generator 534 may generate and transmit a local oscillator signal 550 to filtering device 300/300'/300''/300''', which may provide spur attenuation, as described above, and transmit an output signal 591 to a mixer 596, which frequency upconverts the amplified signal from baseband to RF. Bandpass filter 598 filters the upconverted signal to remove images caused by digital-to-analog conversion and the frequency upconversion. Power amplifier 599 amplifies the upconverted signal and provides an output RF signal having the required power level.

Although communication system 500, as illustrated, includes a single filtering device 300/300'/300''/300''', the disclosed exemplary embodiment is not so limited, and a communication system include a plurality of filtering devices 300/300'/300''/300''' is within the scope of the invention. For example only, a communication system may include a first filtering device 300/300'/300''/300''' coupled between local oscillator 534 and receiver 520 and a second filtering device 300/300'/300''/300''' coupled between local oscillator 534 and transmitter 582. Furthermore, although not shown in FIG. 5 for simplicity, the signals from LO generator 534, low noise amplifier (LNA) 522, power amplifier 599, mixer 524, mixer 594, VGA 526, VGA 594, filtering device 300, filter 598 and filter 528 may comprise complex signals, with each complex signal having an inphase (I) component and a quadrature (Q) component. FIG. 5 shows a specific design for a receiver and a transmitter. In general, the signal conditioning for each path may be performed by one or more stages of amplifier, filter, mixer, and so on. A receiver and a transmitter may include different and/or additional circuit blocks not shown in FIG. 5.

Figure 6:
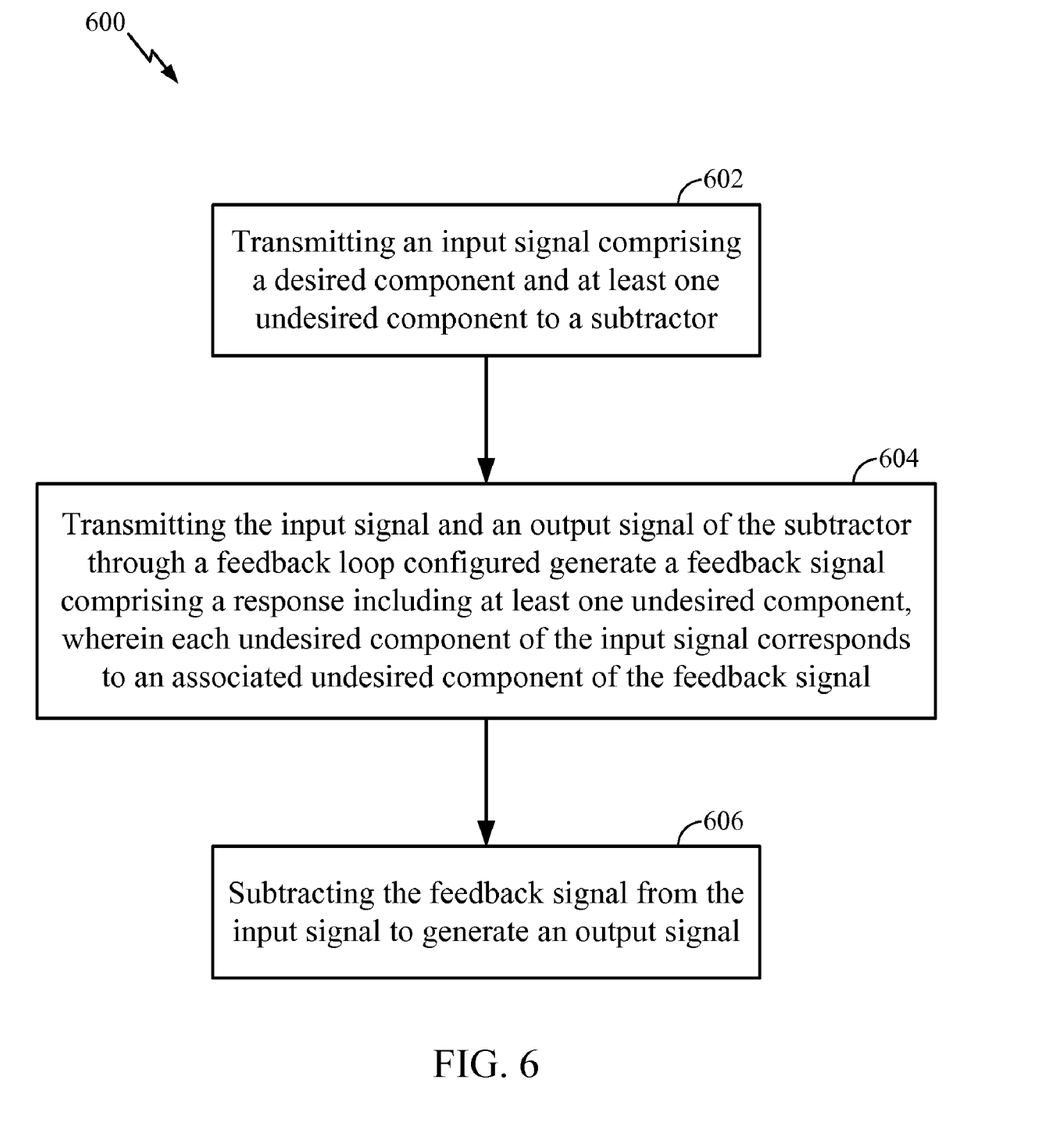
FIG. 6 is a flow-chart illustrating a method of filtering a signal, in accordance with an aspect of the disclosed exemplary embodiment.

FIG. 6 is a flow-chart illustrating a method 600 of filtering a signal, in accordance with one or more exemplary embodiments. Method 600 may include transmitting an input signal comprising a desired component and at least one undesired component to a subtractor (depicted by numeral 602). Method 600 may further include transmitting the input signal and an output signal of the subtractor through a feedback loop configured to generate a feedback signal comprising at least one undesired component, wherein each undesired component of the input signal corresponds to an associated undesired response of the feedback signal (depicted by numeral 604). In addition, method 600 may include subtracting the feedback signal from the input signal to generate an output signal (depicted by numeral 606).

Figure 7:
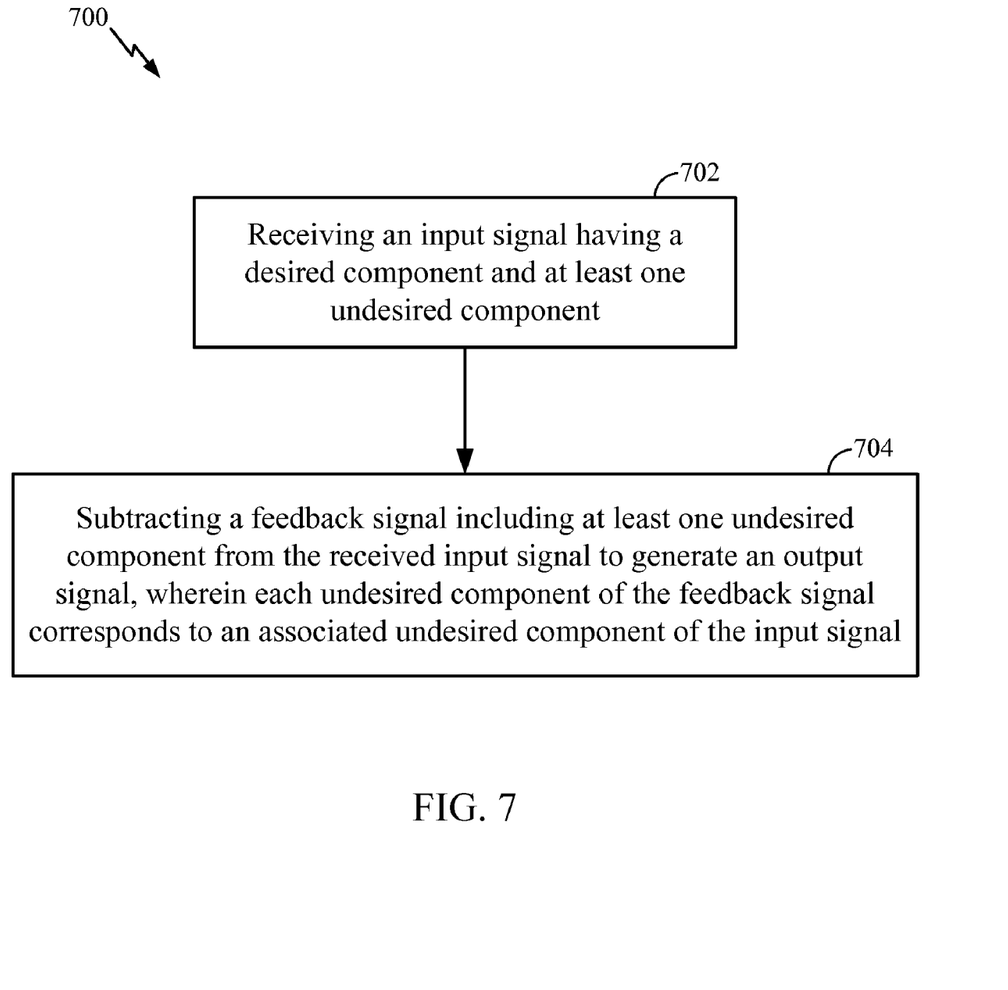
FIG. 7 is a flow-chart illustrating another method of filtering a signal, in accordance with an aspect of the disclosed exemplary embodiment.

FIG. 7 is a flow-chart illustrating another method 700 of filtering a signal, according to one or more exemplary embodiments. Method 700 may include receiving an input signal have a desired component and at least one undesired component (depicted by numeral 702). Furthermore, method 700 may include subtracting a feedback signal including at least one undesired component from the received input signal to generate an output signal, wherein each undesired component of the feedback signal corresponds to an associated undesired component of the input signal (depicted by numeral 704).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the exemplary embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A filtering device, comprising:
   a subtractor operably coupled between an input and an output and to receive an input signal comprising a desired component and at least one undesired component; and
   a feedback loop to receive at least one of the input signal and an output signal from the subtractor and convey a feedback signal comprising at least one undesired component to the subtractor, wherein each undesired component of the feedback signal corresponds to an associated undesired component of the input signal;
   the subtractor to subtract the feedback signal from the input signal and convey the output signal.

2. The filtering device of claim 1, wherein the feedback loop comprises a filter operably coupled between a first multiplier and a second multiplier.

3. The filtering device of claim 2, wherein the filter comprises one of a high-pass filter and a bandpass filter.

4. The filtering device of claim 2, wherein the first multiplier is operably coupled to the input and the output and configured to multiply the input signal by the output signal.

5. The filtering device of claim 2, wherein the first multiplier is operably coupled between the output and a filter and is configured to generate a first signal having a desired component frequency down-converted to DC and corresponding to the desired component of the input signal, the first signal further including at least one undesired component, wherein each undesired component of the first signal is frequency down-converted to a non-DC frequency and corresponds to an associated undesired component of the input signal.

6. The filtering device of claim 5, wherein the first multiplier is configured to multiply the input signal by the output signal to generate the first signal.

7. The filtering device of claim 6, wherein the filter is configured to receive the first signal, filter out the desired component of the first signal, and pass the at least one undesired component of the first signal as a second signal.

8. The filtering device of claim 7, wherein the feedback loop comprises a buffer operably coupled between the first multiplier and the subtractor and configured to amplify the second signal to generate a third signal.

9. The filtering device of claim 8, wherein the second multiplier is operably coupled between the filter and the subtractor and configured to multiply the third signal by the input signal.

10. The filtering device of claim 8, wherein the second multiplier is configured to generate a feedback signal having at least one undesired component, wherein each undesired component of the feedback signal is frequency up-converted to substantially resemble an associated undesired response of the input signal.

11. The filtering device of claim 2, wherein the first multiplier comprises a frequency modulation detector.

12. A method of filtering a signal, comprising:
transmitting an input signal comprising a desired component and at least one undesired component to a subtractor;
transmitting at least one of the input signal and an output signal of the subtractor through a feedback loop configured to generate a feedback signal comprising at least one undesired component, wherein each undesired component of the input signal corresponds to an associated undesired component of the feedback signal; and
subtracting the feedback signal from the input signal to generate an output signal.

13. The method of filtering a signal of claim 12, further comprising conveying the feedback signal to subtractor prior to subtracting the feedback signal from the input signal.

14. The method of claim 12, wherein transmitting the input signal and an output signal through a feedback loop comprises generating a first signal having a desired component down-converted to DC and corresponding to the desired component of the input signal, the first signal further having one or more undesired components, wherein each undesired component of the first signal is down-converted to a non-DC frequency and corresponds to an associated undesired component of the input signal.

15. The method of claim 14, further comprising filtering out the desired component of the first signal and passing each undesired component of the first signal as a second signal.

16. The method of claim 15, further comprising buffering the second signal to generate a third signal.

17. The method of claim 16, further comprising generating a feedback signal having one or more undesired components, wherein each undesired component of the feedback signal corresponds to an associated undesired component of the input signal.

18. A device that facilitates filtering, the device comprising:
means for transmitting an input signal comprising a desired component and at least one undesired component to a subtractor;
means for transmitting at least one of the input signal and an output signal of the subtractor through a feedback loop configured to generate a feedback signal comprising at least one undesired component, wherein each undesired component of the input signal corresponds to an associated undesired component of the feedback signal;
means for subtracting the feedback signal from the input signal to generate an output signal.

19. A method of filtering a signal, comprising:
receiving an input signal having a desired component and at least one undesired component; and
subtracting a feedback signal including at least one undesired component from the received input signal to generate an output signal, wherein each undesired component of the feedback signal corresponds to an associated undesired component of the input signal.

20. The method of claim 19, wherein receiving an input signal comprises receiving an input signal at a subtractor.

21. The method of claim 19, wherein subtracting comprises generating a first signal having a desired component down-converted to DC and corresponding to the desired component of the input signal, the first signal further including one or more undesired components, wherein each undesired component of the first signal is down-converted to a non-DC frequency and corresponds to an associated undesired component of the input signal.

22. The method of claim 21, further comprising filtering the desired component of the first signal and transmitting the at least one undesired component of the first signal as a second signal.

23. The method of claim 22, further comprising amplifying the second signal to generate a third signal.

24. The method of claim 23, further comprising generating a feedback signal having one or more undesired components, wherein each undesired component of the feedback signal corresponds to an associated undesired component of the input signal.

25. A device that facilitates filtering, the device comprising:
means for receiving an input signal having a desired component and at least one undesired component; and
means for subtracting a feedback signal including at least one undesired component from the received input signal to generate an output signal, wherein each undesired component of the feedback signal corresponds to an associated undesired component of the input signal.

26. A system, comprising:
an antenna;
at least one of a transmitter and a receiver coupled to the antenna; and
at least one filtering device operably coupled to at least one of the transmitter and the receiver and configured to receive a signal from a local oscillator, each filtering device comprising:
a subtractor configured to receive an input signal and convey an output signal, wherein the input signal comprises a dominant response and at least one spurious response; and
a feedback loop operably coupled to the subtractor and configured to receive at least one of the input signal and the output signal, generate a feedback signal having at least one spurious response corresponding to the at least one spurious response of the input signal, and convey the feedback signal to the subtractor;
wherein the subtractor is configured to generate an output signal by subtracting the feedback signal from the input signal.

* * * * *